United States Patent
Heinisuo et al.

(10) Patent No.: US 12,193,149 B2
(45) Date of Patent: Jan. 7, 2025

(54) TRACE ROUTABLE RADIATION SHIELD

(71) Applicant: Intel Corporation, Santa Clara, CA (US)

(72) Inventors: Sami Markus Heinisuo, Portland, OR (US); Evan Piotr Kuklinski, North Plains, OR (US); Kari Pekka Johannes Mansukoski, Hillsboro, OR (US); Shawn McEuen, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 866 days.

(21) Appl. No.: 17/132,329

(22) Filed: Dec. 23, 2020

(65) Prior Publication Data

US 2021/0153339 A1 May 20, 2021

(51) Int. Cl.
*H05K 1/02* (2006.01)
*H01L 23/60* (2006.01)

(52) U.S. Cl.
CPC ......... *H05K 1/0219* (2013.01); *H01L 23/60* (2013.01)

(58) Field of Classification Search
CPC ......... H01L 23/552; H01L 2924/3025; H01L 23/60; H01L 23/58; H05K 2201/10371; H05K 1/0218; H05K 1/0219
See application file for complete search history.

(56) References Cited

U.S. PATENT DOCUMENTS

| | | | | |
|---|---|---|---|---|
| 5,354,951 A * | 10/1994 | Lange, Sr. | ........... | H05K 9/0032 174/DIG. 35 |
| 6,313,400 B1 * | 11/2001 | Mosquera | ............. | H05K 5/026 174/363 |
| 6,992,901 B1 * | 1/2006 | Hung | ................... | H05K 9/0009 174/385 |
| 7,095,624 B2 * | 8/2006 | Daoud | ................ | H05K 9/0016 29/830 |
| 8,362,597 B1 | 1/2013 | Foster | | |
| 10,172,263 B1 * | 1/2019 | Martin | ..................... | H01R 4/26 |
| 11,488,880 B2 * | 11/2022 | Nair | .................... | H01L 23/3121 |
| 2020/0093040 A1 * | 3/2020 | Yun | ...................... | H05K 9/0032 |
| 2020/0305305 A1 | 9/2020 | Zhao et al. | | |

FOREIGN PATENT DOCUMENTS

EP 4020549 A1 6/2022
WO 2009037807 A1 3/2009

OTHER PUBLICATIONS

European Extended Search Report issued in EP Application No. 21 19 8561.9 on Feb. 28, 2022; 11 pages.

* cited by examiner

*Primary Examiner* — James Wu
(74) *Attorney, Agent, or Firm* — Banner & Witcoff Ltd.

(57) ABSTRACT

Particular embodiments described herein provide for an electronic device that can be configured to include a substrate that includes traces, a radiation source on the substrate, and a trace routable radiation shield on the substrate. At least a portion of the traces extend through the trace routable radiation shield and the trace routable radiation shield can help shield radiation sensitive components from at least a portion of the radiation from the radiation source.

17 Claims, 11 Drawing Sheets

TRACE ROUTABLE RADIATION SHIELD

TECHNICAL FIELD

This disclosure relates in general to the field of computing, and more particularly, to a trace routable radiation shield.

BACKGROUND

Emerging trends in systems place increasing performance demands on the system. One way to attempt to improve performance and function is to increase the density of the devices and systems and pack more computing elements into the devices and systems. The increasing performance demands can create a relatively crowded system as more and more components are located in close proximity to each and can cause radiating noise level increases in the system. More specifically, the increase in computing elements often causes elevated noise levels in systems. Electromagnetic interference (EMI) and radio-frequency interference (RFI) affect almost every electronic device, especially mobile compute devices. In addition, electrical components are both a source of electromagnetic and radio-frequency radiation and are susceptible to EMI/RFI from adjacent sources. The radiating noise level can cause a reduction in device performance, a reduction in the lifetime of a device, and/or delays in data throughput, especially in a crowded system. In addition, as more computing elements are packed into the systems, trace routing can become difficult.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

Figure 1:
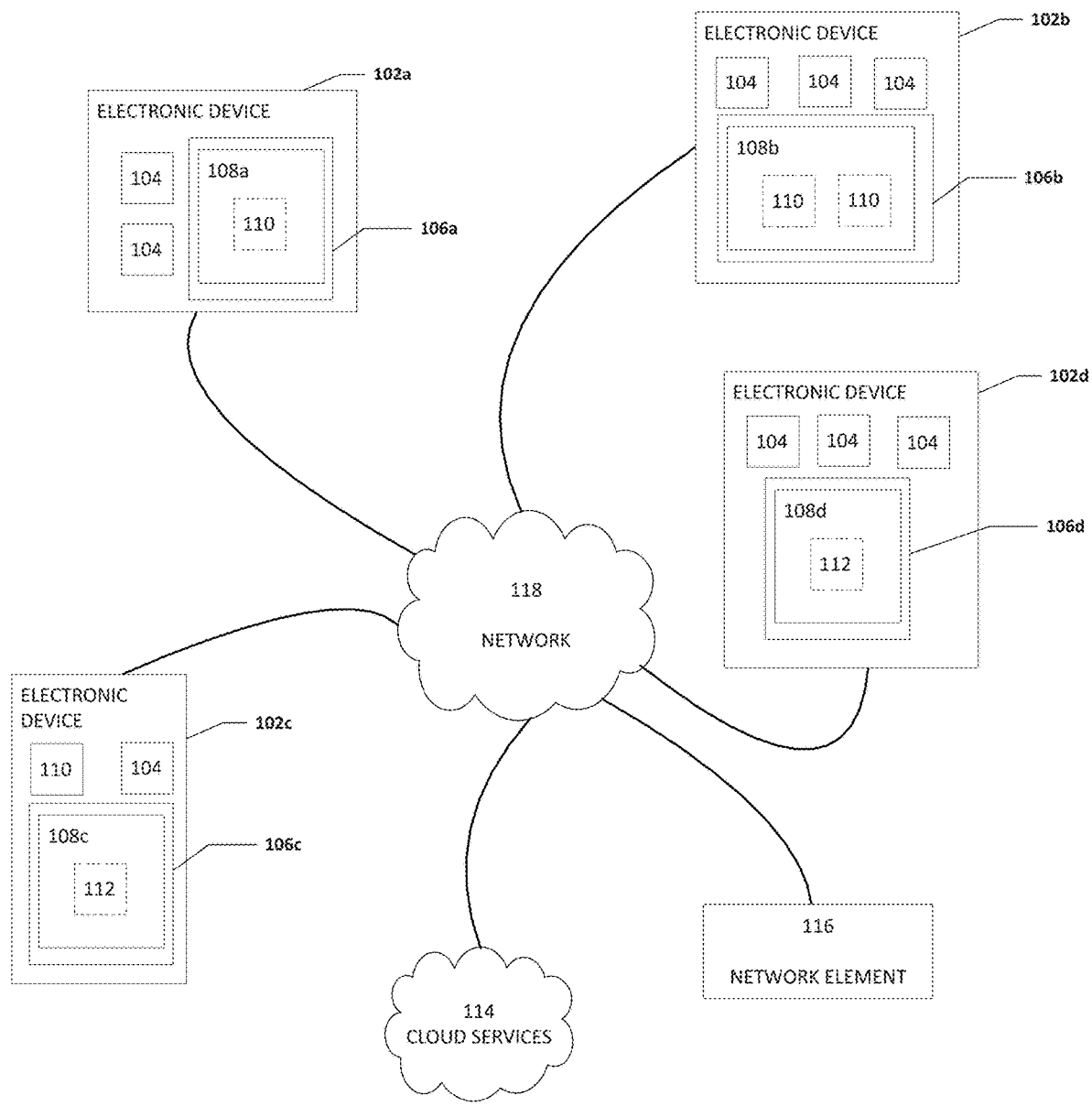
FIG. 1 is a simplified block diagram of a system to enable a trace routable radiation shield, in accordance with an embodiment of the present disclosure.

The FIGURES of the drawings are not necessarily drawn to scale, as their dimensions can be varied considerably without departing from the scope of the present disclosure.

DETAILED DESCRIPTION

Example Embodiments

The following detailed description sets forth examples of apparatuses, methods, and systems relating to enabling a trace routable radiation shield. Features such as structure(s), function(s), and/or characteristic(s), for example, are described with reference to one embodiment as a matter of convenience; various embodiments may be implemented with any suitable one or more of the described features.

In the following description, various aspects of the illustrative implementations will be described using terms commonly employed by those skilled in the art to convey the substance of their work to others skilled in the art. However, it will be apparent to those skilled in the art that the embodiments disclosed herein may be practiced with only some of the described aspects. For purposes of explanation, specific numbers, materials, and configurations are set forth in order to provide a thorough understanding of the illustrative implementations. However, it will be apparent to one skilled in the art that the embodiments disclosed herein may be practiced without the specific details. In other instances, well-known features are omitted or simplified in order not to obscure the illustrative implementations.

The terms "over," "under," "below," "between," and "on" as used herein refer to a relative position of one layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "directly on" a second layer is in direct contact with that second layer. Similarly, unless explicitly stated otherwise, one feature disposed between two features may be in direct contact with the adjacent features or may have one or more intervening layers.

Implementations of the embodiments disclosed herein may be formed or carried out on or over a substrate, such as a non-semiconductor substrate or a semiconductor substrate. In one implementation, the non-semiconductor substrate may be silicon dioxide, an inter-layer dielectric composed of silicon dioxide, silicon nitride, titanium oxide and other transition metal oxides. Although a few examples of materials from which the non-semiconducting substrate may be formed are described here, any material that may serve as a foundation upon which a non-semiconductor device may be built falls within the spirit and scope of the embodiments disclosed herein.

In another implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. In other examples, the substrate may be a flexible substrate including 2D materials such as graphene and molybdenum disulphide, organic materials such as pentacene, transparent oxides such as indium gallium zinc oxide poly/amorphous (low temperature of dep) III-V semiconductors and germanium/silicon, and other non-silicon flexible substrates. Although a few examples of materials from which the substrate may be formed are described here, any material that may serve as a foundation upon which a semiconductor device may be built falls within the spirit and scope of the embodiments disclosed herein.

In the following detailed description, reference is made to the accompanying drawings that form a part hereof wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense. For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). Reference to "one embodiment" or "an embodiment" in the present disclosure means that a particular feature, structure, or characteristic described in connection with the embodiment is included in at least one embodiment. The appearances of the phrase "in one embodiment" or "in an embodiment" are not necessarily all referring to the same embodiment. The appearances of the phrase "for example," "in an example," or "in some examples" are not necessarily all referring to the same example. The term "about" indicates a tolerance of ten percent (10%). For example, about one (1) mm would include one (1) mm and ±0.1 mm from one (1) mm.

FIG. 1 is a simplified block diagram of an electronic device configured with a trace routable radiation shield, in accordance with an embodiment of the present disclosure. In an example, an electronic device can include one or more trace routable radiation shields coupled to a substrate. For example, as illustrated in FIG. 1, electronic device 102a includes one or more electronics 104, a substrate 106a, a trace routable radiation shield 108a, and a radiation source 110. Radiation source 110 can be on or over substrate 106a and trace routable radiation shield 108a can be over radiation source 110 to help contain or mitigate the radiation from radiation source 110 from extending past trace routable radiation shield 108a or at least partially contain or mitigate the radiation from radiation source 110 from extending past trace routable radiation shield 108a. In addition, electronic device 102b includes one or more electronics 104, a substrate 106b, a trace routable radiation shield 108b, and two or more radiation sources 110. Radiation sources 110 can be on or over substrate 106b and trace routable radiation shield 108b can be over radiation sources 110 to help contain or mitigate the radiation from radiation sources 110 from extending past trace routable radiation shield 108b or at least partially contain or mitigate the radiation from radiation source 110 from extending past trace routable radiation shield 108b.

Also, electronic device 102c includes one or more electronics 104, a substrate 106c, a trace routable radiation shield 108c, radiation source 110, and a radiation sensitive device 112. Radiation sensitive device 112 can be on or over substrate 106c and trace routable radiation shield 108c can be over radiation sensitive device 112 to help shield radiation sensitive device 112 from the radiation of radiation sources 110. Further, electronic device 102d includes one or more electronics 104, a substrate 106d, a trace routable radiation shield 108d, and radiation sensitive device 112. Radiation sensitive device 112 can be on or over substrate 106d and trace routable radiation shield 108d can be over radiation sensitive device 112 to help shield radiation sensitive device 112 from the radiation from radiation sources outside of electronic device 102d. Each of electronic devices 102a-120d may be in communication with each other, cloud services 114, and/or network element 116 using network 118. In some examples, one or more of electronic devices 102a-102d may be standalone devices and not connected to network 118 or another device.

Each of radiation shields 108a-108d can be configured to allow for trace routing and to shield one or more electronic components from radiation from a radiation source. A trace is a conductive path that electrically connects one or more connectors and/or one or more components to each other. The radiation may be electromagnetic radiation, internal and external Wi-Fi and cellular radio-frequency radiation, high speed input/output (I/O) trace/connector digital noise radiation, switching voltage regulator radiation, or some other type of radiation that can have an undesirable effect on one or more components of an electronic device. For example, electromagnetic interference (EMI) and radio-frequency interference (RFI) affect almost every electronic device, especially mobile compute devices. System on a chip (SoC) packages are both a source of electromagnetic radiation and radio-frequency radiation and are susceptible to EMI/RFI from adjacent sources. For example, when a smartphone is placed on or near a keyboard of a laptop, performance of the laptop is often impacted (e.g., laptop screen flicker, CPU hang, reboot of the system, etc.). The term "radiation" includes electromagnetic radiation, radio-frequency radiation, and other similar radiation that can cause an undesirable effect on one or more components of an electronic device.

In addition, because there is a limited space in a printed circuit board, it can be difficult to design traces in an electronic device, especially when the housing of the electronic device is crowded and trace routing in heavily constricted areas can be especially problematic. Each of radiation shields 108a-108d can be configured to include a trace routable fence to allow for extra routing layers in a Z-direction. The trace routable fence allows for extra localized routing layers in high density areas without any additional system Z-height impact. In addition, the trace routable fence can provide a routing path for insensitive traces and/or for power delivery and can allow for more space for high-speed signals on a mother board. The traces in trace routable fence can be etched the same way as traces are etched on a substrate (e.g., PCB, motherboard, etc.) and the trace routable fence can allow the traces to run through it, up and along its walls, and then back down to the substrate. Allowing the traces to be routed through the walls of the trace routable fence helps to make room in choke areas that occur in a crowded substrate and can free up space that would otherwise be occupied by the traces that are routed through the walls of the trace routable fence.

It is to be understood that other embodiments may be utilized and structural changes may be made without departing from the scope of the present disclosure. Substantial flexibility is provided in that any suitable arrangements and configuration may be provided without departing from the teachings of the present disclosure.

Elements of FIG. 1 may be coupled to one another through one or more interfaces employing any suitable connections (wired or wireless), which provide viable pathways for network (e.g., network 118, etc.) communications. Additionally, any one or more of these elements of FIG. 1 may be combined or removed from the architecture based on particular configuration needs. Network 118 may include a configuration capable of transmission control protocol/Internet protocol (TCP/IP) communications for the transmission or reception of packets in a network. Each of electronic devices 102*a*-102*d* may also operate in conjunction with a user datagram protocol/IP (UDP/IP) or any other suitable protocol where appropriate and based on particular needs.

For purposes of illustrating certain example techniques, the following foundational information may be viewed as a basis from which the present disclosure may be properly explained. End users have more media and communications choices than ever before. A number of prominent technological trends are currently afoot (e.g., more computing elements, more online video services, more Internet traffic, more complex processing, etc.), and these trends are changing the expected performance of devices as devices and systems are expected to increase performance and function. One way to increase performance and function is to increase the density of the devices and systems and pack more computing elements into the devices and systems. However, the increase in computing elements causes an increase in the EMI and RFI. EMI and RFI affect almost every electronic device, especially mobile compute devices. In addition, SoC packages are both a source of electromagnetic and radio-frequency radiation and are susceptible to EMI/RFI from adjacent sources.

Die and package radiation have been identified as RFI risk factors. In addition, radio frequency signals from internal radios and external smartphones in proximity to personal computers have interfered with the SoCs and caused basic functionality issues, including display flickering and system hang/reboot. Some SoC designs introduce disaggregation and multichip package (MCP) using an embedded multi-die interconnect bridge (EMIB) which can increase both RFI and immunity risk. Also, scalable package-level shielding techniques (simultaneously shielding both the package and the dies) are required for some Internet of things (IoT), data centers, SoCs, and seven (7)/ten (10) nm disaggregated systems.

In some systems, the package layer-count increases to provide a package surface shielding with a ground layer at the expense of package cost and Z-height. However, this can be insufficient because of multiple-die radiation. In addition, package surface shielding with an additional ground layer reduces radio frequency noise radiation/coupling at the expense of package cost and Z-height increases. In other systems, a conductive coating may be used. However, conductive coating, such as metal sputtering, is considered to be prohibitively-expensive and is an uncertified manufacturing process for SoC applications and high-volume manufacturing.

In other systems, an on-board shield solution may be used to implement a Faraday cage with a motherboard and PCB ground contacts. While on-board shielding solutions are relatively common, they require good ground stitching between the Faraday cage and motherboard and PCB ground contacts. In general, about 2.5 to about five (5) mm ground stitching space (about $\lambda/20$ to about $\lambda/10$) is required to provide good shielding effectiveness up to about five (5) to about six (6) GHz WiFi channels. This requirement is almost impossible to meet for Type-3 PCBs and for compact size shielding solutions, especially for SoCs with high-density interconnects. Increasing the size of shielding for its placement around less dense PCB areas can cause mechanical warp, height increase, and thermal contact issues. The shielding effectiveness significantly relies on PCB designs and technologies (e.g., Type-3 PCB vs. Type-4 PCB). The on-board shielding solutions are applicable only for Type-4 PCBs, which are higher in cost than Type-3 and are used only for a small number of premium PCs. High volume PCs are designed with Type-3 PCBs.

Further, to maximize battery life, many mobile systems attempt to carve out as much space for energy storage as physically possible. Inevitably, various other components (e.g., speaker boxes, motherboard, memory, storage, etc.) are arranged or sacrificed to cater to the volume occupied by the battery. In the case of the motherboard, this has the potential to limit good design practices, especially from a SI/PI point of view. For example, choke points occur where there is not enough room to effectively route traces. The easiest solution is to add layers to the PCB, but in many cases, this is not preferred due to Z-height limitations on thin mobile devices. Consequently, concessions are required whether it be in I/O, connectivity, fidelity, or entire system features are sacrificed. Trace routing of these heavily constricted areas is a problem that is even addressed at an architecture level. Trace-length dependent sectors of an SOC are situated (2D) in specific orientations to allow for the most efficient means of routing from a central point to the rest of the system. As a result, saving space in mobile devices without negatively affecting these vital traces requires creativity in how the board design is approached. Some current solutions use entirely populated boards soldered face-to face. These systems can make use of an interposing spacer to transmit signals to the boards. However, populating two boards and then soldering their primary sides together and having components facing each other can create potential yield issues and therefore proportional cost scaling. Also, stacking components on top of each other demands an increase in Z-height. What is needed is a radiation shield that can be coupled to a substrate such that the radiation shield is part of the substrate for trace routing purposes.

A system to create a trace routable radiation shield, as outlined in FIG. 1, can resolve these issues (and others). In an example, a radiation shield (e.g., trace routable radiation shield 108) can provide the ability of routing around shielded zones. Instead of using a formed sheet metal EMI fence, the trace routable radiation shield can use a trace routable fence. The trace routable fence is then soldered to the substrate, allowing traces to be routed within the trace routable fence. To complete its function as a radiation shield, a radiation lid can be secured over the trace routable fence. In some examples the radiation lid is snapped over or onto the trace routable fence. The radiation lid can also be secured to the trace routable fence using conductive tape or embossed copper for heatsinking.

In a specific illustrative example, power delivery for SoC takes four different layers on a main board (e.g., substrate). This power delivery can be diverted into the trace routable fence. By routing the power delivery through the trace routable fence, the power planes can be at least partially removed from the main board. This allows for an extensive amount of extra room on layers L3, L4, and L9 and especially for increased room for routing on L4. In the case of L9, which is heavily routed with high-speed signals, the extra room can dramatically improve signal integrity (SI).

The trace routable fence is not limited by a width and can be any width depending on design constraints and needed trace routing accommodations. As a result, in some examples, the trace routable fence can improve power delivery by allowing for a larger power plane and by allowing for the capacitors to be located closer to electronic components.

Turning to the network infrastructure of FIG. 1, network 118 represents a series of points or nodes of interconnected communication paths for receiving and transmitting packets of information. Network 118 offers a communicative interface between nodes, and may be configured as any local area network (LAN), virtual local area network (VLAN), wide area network (WAN), wireless local area network (WLAN), metropolitan area network (MAN), Intranet, Extranet, virtual private network (VPN), and any other appropriate architecture or system that facilitates communications in a network environment, or any suitable combination thereof, including wired and/or wireless communication.

In network 118, network traffic, which is inclusive of packets, frames, signals, data, etc., can be sent and received according to any suitable communication messaging protocols. Suitable communication messaging protocols can include a multi-layered scheme such as Open Systems Interconnection (OSI) model, or any derivations or variants thereof (e.g., Transmission Control Protocol/Internet Protocol (TCP/IP), user datagram protocol/IP (UDP/IP)). Messages through the network could be made in accordance with various network protocols, (e.g., Ethernet, Infiniband, OmniPath, etc.). Additionally, radio signal communications over a cellular network may also be provided. Suitable interfaces and infrastructure may be provided to enable communication with the cellular network.

The term "packet" as used herein, refers to a unit of data that can be routed between a source node and a destination node on a packet switched network. A packet includes a source network address and a destination network address. These network addresses can be Internet Protocol (IP) addresses in a TCP/IP messaging protocol. The term "data" as used herein, refers to any type of binary, numeric, voice, video, textual, or script data, or any type of source or object code, or any other suitable information in any appropriate format that may be communicated from one point to another in electronic devices and/or networks.

In an example implementation, electronic devices 102a-102d are meant to encompass a computer, a personal digital assistant (PDA), a laptop or electronic notebook, a cellular telephone, a smartphone, an IP phone, network elements, network appliances, servers, routers, switches, gateways, bridges, load balancers, processors, modules, or any other device, component, element, or object that includes a radiation source and/or a radiation sensitive device. Each of electronic devices 102a-120d may include any suitable hardware, software, components, modules, or objects that facilitate the operations thereof, as well as suitable interfaces for receiving, transmitting, and/or otherwise communicating data or information in a network environment. This may be inclusive of appropriate algorithms and communication protocols that allow for the effective exchange of data or information. Each of electronic devices 102a-120d may include virtual elements.

In regards to the internal structure, each of electronic devices 102a-120d can include memory elements for storing information to be used in operations. Each of electronic devices 102a-120d may keep information in any suitable memory element (e.g., random access memory (RAM), read-only memory (ROM), erasable programmable ROM (EPROM), electrically erasable programmable ROM (EEPROM), application specific integrated circuit (ASIC), etc.), software, hardware, firmware, or in any other suitable component, device, element, or object where appropriate and based on particular needs. Any of the memory items discussed herein should be construed as being encompassed within the broad term 'memory element.' Moreover, the information being used, tracked, sent, or received could be provided in any database, register, queue, table, cache, control list, or other storage structure, all of which can be referenced at any suitable timeframe. Any such storage options may also be included within the broad term 'memory element' as used herein.

In certain example implementations, functions may be implemented by logic encoded in one or more tangible media (e.g., embedded logic provided in an ASIC, digital signal processor (DSP) instructions, software (potentially inclusive of object code and source code) to be executed by a processor, or other similar machine, etc.), which may be inclusive of non-transitory computer-readable media. In some of these instances, memory elements can store data used for operations. This includes the memory elements being able to store software, logic, code, or processor instructions that are executed to carry out operations or activities.

Additionally, each of electronic devices 102a-102d can include one or more processors that can execute software or an algorithm. In one example, the processors could transform an element or an article (e.g., data) from one state or thing to another state or thing. In another example, activities may be implemented with fixed logic or programmable logic (e.g., software/computer instructions executed by a processor) and the elements identified herein could be some type of a programmable processor, programmable digital logic (e.g., a field programmable gate array (FPGA), an erasable programmable read-only memory (EPROM), an electrically erasable programmable read-only memory (EEPROM)) or an ASIC that includes digital logic, software, code, electronic instructions, or any suitable combination thereof. Any of the potential processing elements, modules, and machines described herein should be construed as being encompassed within the broad term 'processor.'

Figure 2:
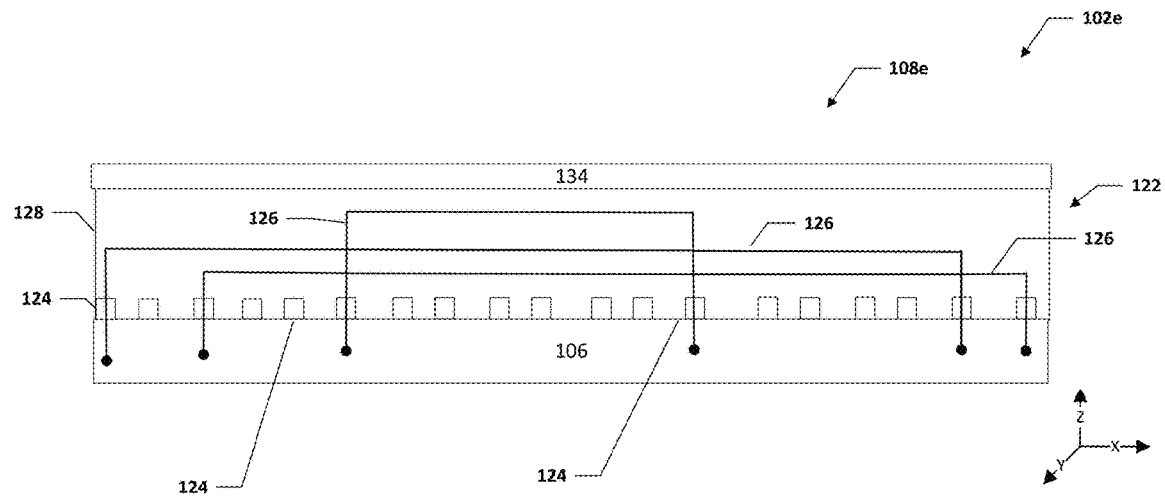
FIG. 2 is a simplified block diagram of a partial side cut away view of system to enable a trace routable radiation shield, in accordance with an embodiment of the present disclosure.

Turning to FIG. 2, FIG. 2 is a simplified block diagram of a side cut away view of an electronic device 102e, in accordance with an embodiment of the present disclosure. In an example, electronic device 102e includes a trace routable radiation shield 108e. Trace routable radiation shield 108e can include trace routable fence 122 and radiation shield 134. Trace routable fence 122 can include non-conductive body 128 and include or be over a plurality of trace paths 124. Trace paths 124 can be a conductive path or pad that helps couple trace routable fence 122 to substrate 106 and provide a path for traces 126. More specifically, at least a portion of the traces 126 in substrate 106 can electrically couple with trace paths 124 to electrically couple with the traces 126 in non-conductive body 128 of trace routable fence 122 and allow traces to be routed from substrate 106 to trace routable fence 122 and from trace routable fence 122 back to substrate 106. In some examples, a trace path 124 is a terminating end of a trace 126 in the non-conductive body 128 of the trace routable fence 122.

Trace routable fence 122 can be comprised of the same or similar material as substrate 106 or some other non-conductive material that allows traces to extend through trace routable fence 122. Trace paths 124 can be comprised of a conductive material to allow traces 126 to be routed from substrate 106 to trace routable fence 122 and from trace routable fence 122 to substrate 106. Trace paths 124 help connect trace routable fence 122 to traces, vias, layers, etc. internal to substrate 106 and/or through intermediate traces, vias, layers, etc. In some examples, trace paths 124 are coupled to substrate 106 through a ball grid array connection or other surface-mount packaging connections to help connect trace routable fence 122 to traces, vias, layers, etc. internal to substrate 106. In some examples, trace paths 124 can add mechanical stiffness to substrate 106 via solder joint. Traces 126 can be comprised of copper, aluminum, or some other conductive material that electrically connects one or more electronic components together (e.g., integrated circuit, capacitors, resistors, battery, etc.). The width, height, and profile of trace routable fence 122 depends on design constraints, the number of traces to be included in trace routable fence 122, etc. In a specific example, trace routable fence 122 has a width of about 1.5 mm.

Figure 3:
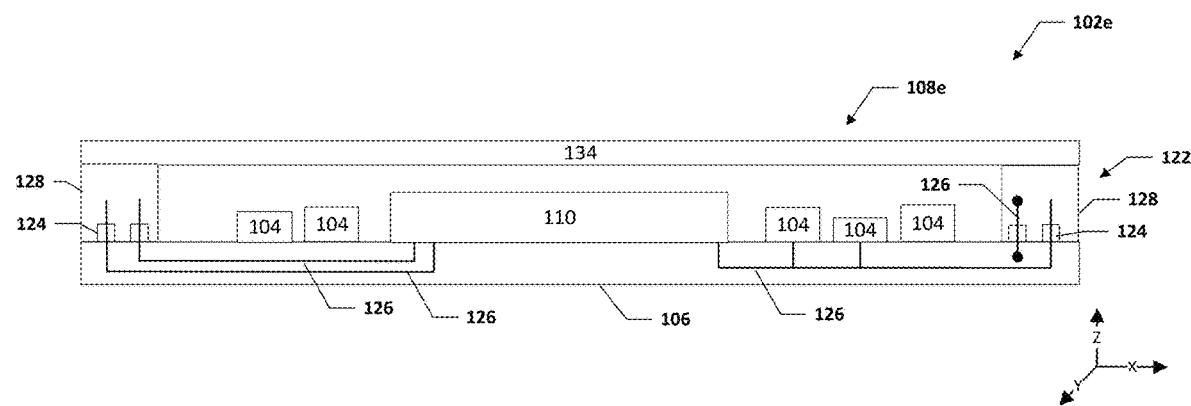
FIG. 3 is a simplified block diagram of a partial view of a system to enable a trace routable radiation shield, in accordance with an embodiment of the present disclosure.

Turning to FIG. 3, FIG. 3 is a simplified block diagram of a side cut away view of a portion of electronic device 102e in accordance with an embodiment of the present disclosure. Electronic device 102e can include electronics 104, substrate 106, a trace routable radiation shield 108e, and radiation source 110. Trace routable radiation shield 108e can include trace routable fence 122 and radiation shield 134. Trace routable fence 122 can include or be over plurality of trace paths 124. Trace paths 124 can help couple trace routable fence 122 to substrate 106 and provide a path for traces 126.

Figure 4:
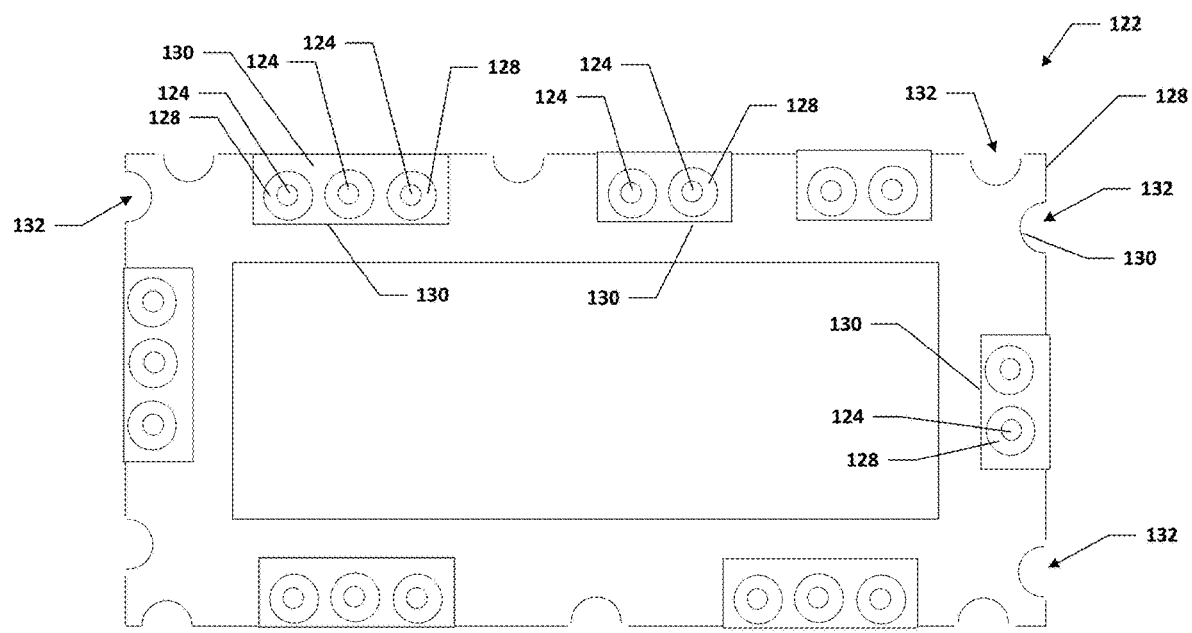
FIG. 4 is a simplified block diagram of a portion of a system to enable a trace routable radiation shield, in accordance with an embodiment of the present disclosure.

Turning to FIG. 4, FIG. 4 is a simplified block diagram of a bottom cut away view of trace routable fence 122 in accordance with an embodiment of the present disclosure. Trace routable fence 122 can include trace paths 124, non-conductive body 128, ground 130, and radiation shield coupler housing 132. Radiation shield coupler housing 132 can be recessed into trace routable fence 122 and can include ground 130. Non-conductive body 128 can be comprised of the same material as a substate (e.g., substrate 106) that is coupled to trace routable fence 122 or of a different non-conductive material. Ground 130 in radiation shield coupler housing 132 can be coupled to a ground plane (e.g., ground plane 144 illustrated in FIG. 7) of a substate (e.g., substrate 106 illustrated in FIG. 7) that is coupled to trace routable fence 122. Radiation shield coupler housing 132 can help couple and secure a radiation shield lid (e.g., radiation shield 134) to trace routable fence 122.

Figure 5:
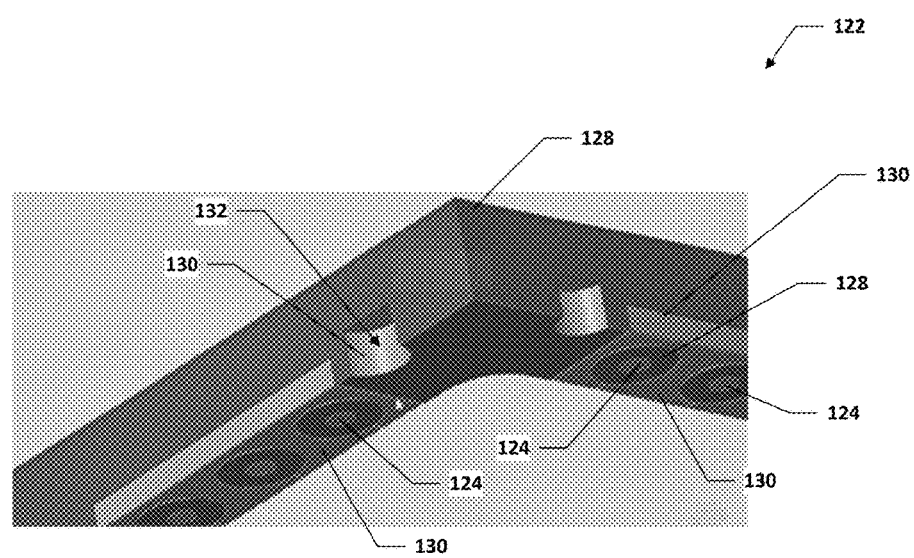
FIG. 5 is a simplified block diagram of a portion of a system to enable a trace routable radiation shield, in accordance with an embodiment of the present disclosure.

Turning to FIG. 5, FIG. 5 is a simplified block diagram of a perspective view of trace routable fence 122 in accordance with an embodiment of the present disclosure. Trace routable fence 122 can include trace paths 124, non-conductive body 128, ground 130, and radiation shield coupler housing 132. Radiation shield coupler housing 132 can include ground 130. Radiation shield coupler housing 132 can have a half moon or semi-circle profile.

Figure 6:
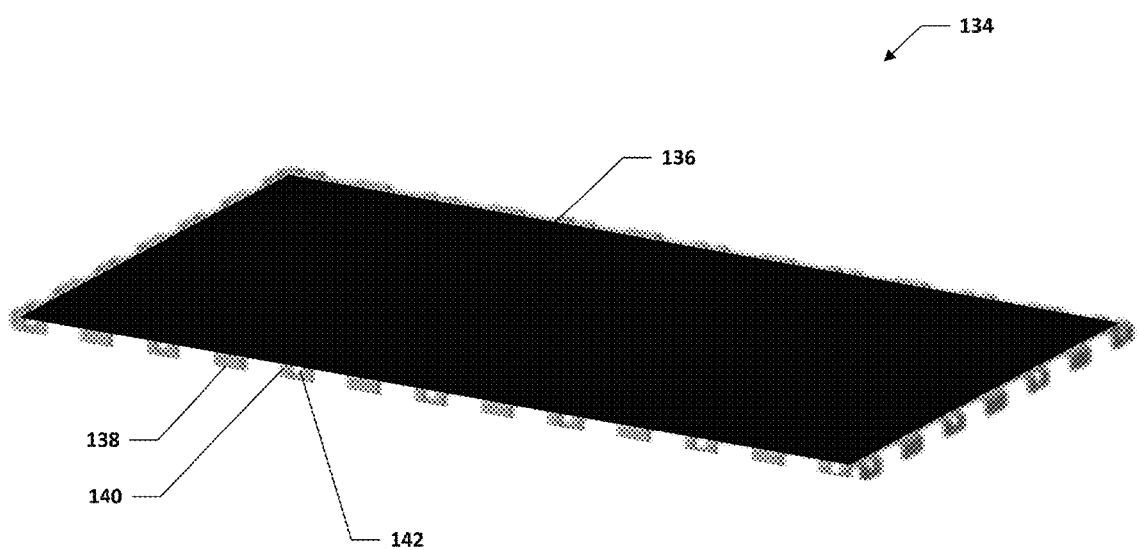
FIG. 6 is a simplified block diagram of a portion of a system to enable a trace routable radiation shield, in accordance with an embodiment of the present disclosure.

Turning to FIG. 6, FIG. 6 is a simplified block diagram of a perspective view of radiation shield 134 in accordance with an embodiment of the present disclosure. Radiation shield 134 can include radiation shield lid 136, ground coupling 138, and radiation shield coupler 140. Radiation shield coupler 140 can include securing dimple 142. In an example, radiation shield lid 136 is a conducive material and includes stainless steel, copper, an alloy such as nickel copper, or some material that is conductive, rigid, and can help provide for a radiation shield. Ground coupling 138 can be configured to align with ground 130 on trace routable fence 122 to provide a ground connection for radiation shield 134. Radiation shield coupler 140 can be configured to align with radiation shield coupler housing 132 such that securing dimple 142 fits into radiation shield coupler housing 132 and helps to secure radiation shield 134 to trace routable fence 122. In some examples, ground coupling 138 and radiation shield coupler 140 are soldered to trace routable fence 122 and radiation shield coupler 140 does not include securing dimple 142. In other examples, ground coupling 138 and radiation shield coupler 140 are not present on radiation shield 134 and radiation shield lid 136 is secured to trace routable fence 122 using copper tape, a conductive adhesive tape, or some other material that can help ground radiation shield lid 136 and secure radiation shield lid 136 to trace routable fence 122.

Figure 7:
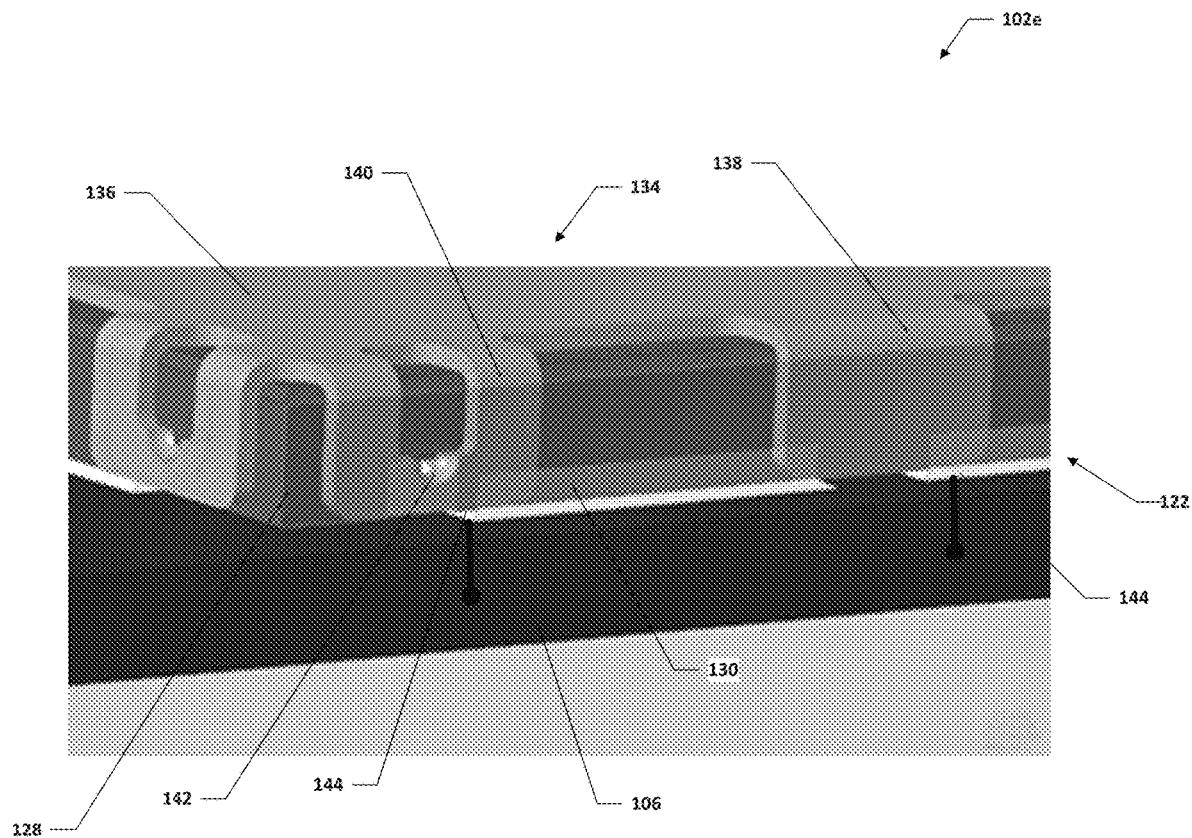
FIG. 7 is a simplified block diagram of a portion of a system to enable a trace routable radiation shield, in accordance with an embodiment of the present disclosure.

Turning to FIG. 7, FIG. 7 is a simplified block diagram of a portion of electronic device 102e in accordance with an embodiment of the present disclosure. Electronic device 102e can include trace routable radiation shield 108e over substrate 106. Substrate 106 can include ground plane 144. Trace routable radiation shield 108e can include trace routable fence 122 and radiation shield 134. Trace routable fence 122 can include trace paths 124 (not shown), non-conductive body 128, ground 130, and radiation shield coupler housing 132 (not shown). Radiation shield 134 can include radiation shield lid 136, ground coupling 138, and radiation shield coupler 140. Radiation shield coupler 140 can include securing dimple 142.

Ground coupling 138 can be configured to align with ground 130 on trace routable fence 122 to provide a ground connection for radiation shield 134. Ground 130 on trace routable fence 122 is coupled to ground plane 144. Radiation shield coupler 140 can be configured to align with radiation shield coupler housing 132 (not shown) such that securing dimple 142 fits into radiation shield coupler housing 132 and helps to secure radiation shield 134 to trace routable fence 122. In an example, when radiation shield 134 is secured to trace routable fence 122, radiation shield 134 is pushed downward onto trace routable fence 122. Because of securing dimple 142 on radiation shield coupler 140, radiation shield coupler 140 deflects out until securing dimple 142 couples with radiation shield coupler housing 132 and dimple clips into radiation shield coupler housing 132 to help retain and secure radiation shield lid 136 to trace routable fence 122. Radiation shield coupler housing 132 can include ground 130 (e.g., as illustrated in FIGS. 4 and 5) to help ground radiation shield 134.

Figure 8A:
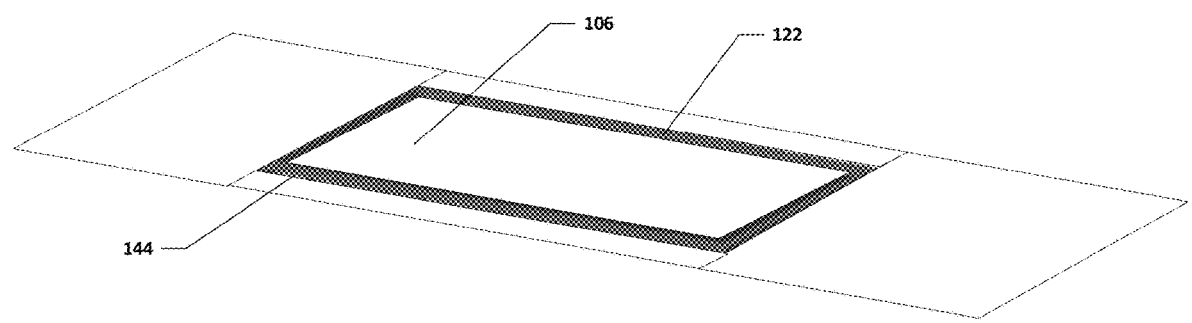
FIG. 8A is a simplified block diagram of a portion of a system to enable a trace routable radiation shield, in accordance with an embodiment of the present disclosure.

Turning to FIG. 8A, FIG. 8A is a simplified block diagram of the early stages of the formation of a trace routable radiation shield. In an example, trace routable fence 122 is added to a substrate 106. Trace routable fence 122 can be comprised of the same or similar material as substrate 106 or some other non-conductive material that allows traces to extend through trace routable fence 122. Substrate 106 can include ground plane 144.

Figure 8B:
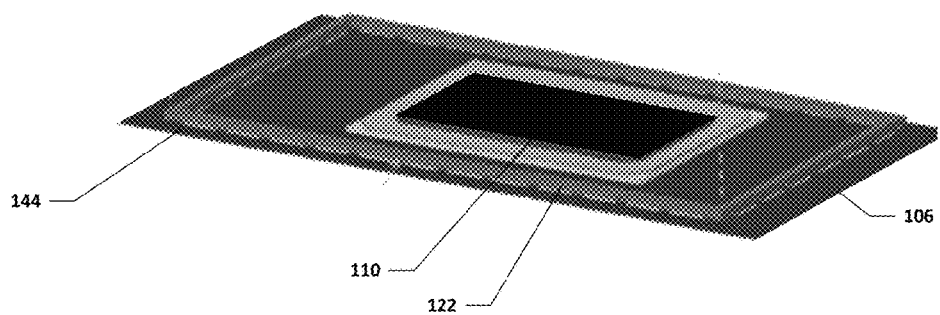
FIG. 8B is a simplified block diagram of a portion of a system to enable a trace routable radiation shield, in accordance with an embodiment of the present disclosure.

Turning to FIG. 8B, FIG. 8B is a simplified block diagram of the early stages of the formation of a trace routable radiation shield. In an example, trace routable fence 122 is added to a substrate 106, radiation source 110 and one or more electronics 104 (not shown) can be added to substrate 106. In some examples, trace routable fence 122 is added when radiation source 110 and one or more electronics 104 are added to substrate 106. Substrate 106 can include ground plane 144.

Figure 8C:
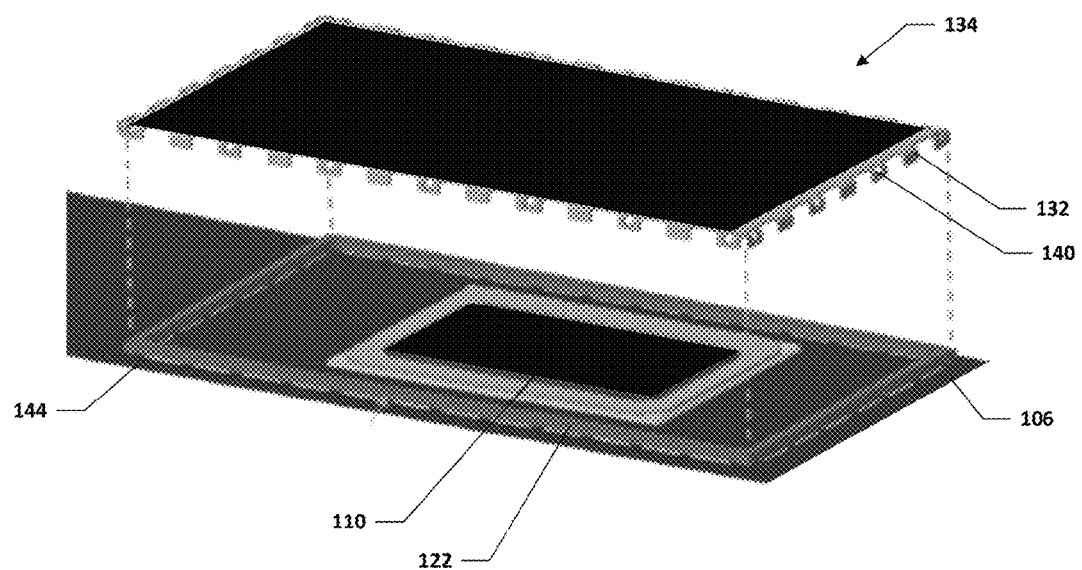
FIG. 8C is a simplified block diagram of a portion of a system to enable a trace routable radiation shield, in accordance with an embodiment of the present disclosure.

Turning to FIG. 8C, FIG. 8C is a simplified block diagram of the formation of a trace routable radiation shield. In an example, after trace routable fence 122, radiation source 110, and one or more electronics 104 (not shown) are added to substrate 106, radiation shield 134 can be added to trace routable fence 122. Radiation shield 134 can include radiation shield coupler housing 132 and radiation shield coupler 140. In some examples, radiation shield 134 is added to trace routable fence 122 using adhesive, tape, a snap type coupling mechanism, and/or some other means of adding radiation shield 134 onto trace routable fence 122. Substrate 106 can include ground plane 144.

Figure 8D:
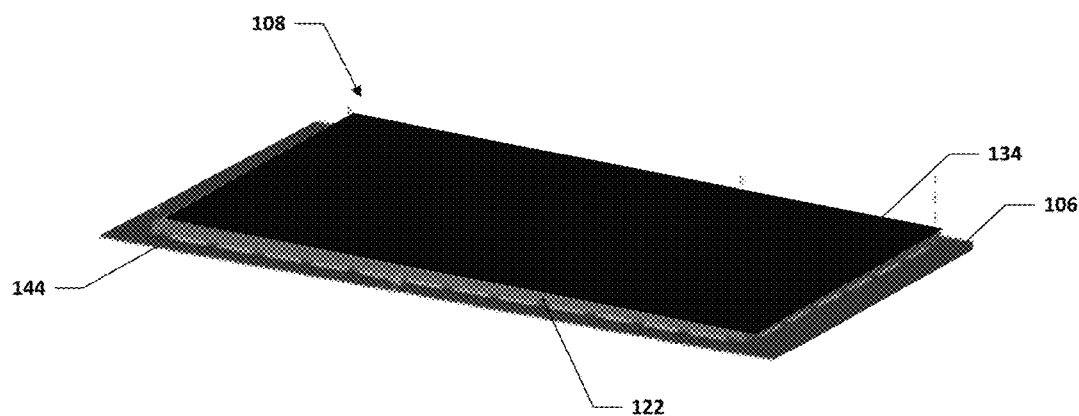
FIG. 8D is a simplified block diagram of a portion of a system to enable a trace routable radiation shield, in accordance with an embodiment of the present disclosure.

Turning to FIG. 8D, FIG. 8D is a simplified block diagram of the formation of a trace routable radiation shield. In an example, after trace routable fence 122, radiation source 110, and one or more electronics 104 (not shown) are added to substrate 106, radiation shield 134 is secured to trace routable fence 122 to create trace routable radiation shield 108. Radiation shield 134 can be added to trace routable fence 122 using adhesive, tape, a snap type coupling mechanism, and/or some other means of coupling radiation shield 134 to trace routable fence 122. Substrate 106 can include ground plane 144.

Figure 9:
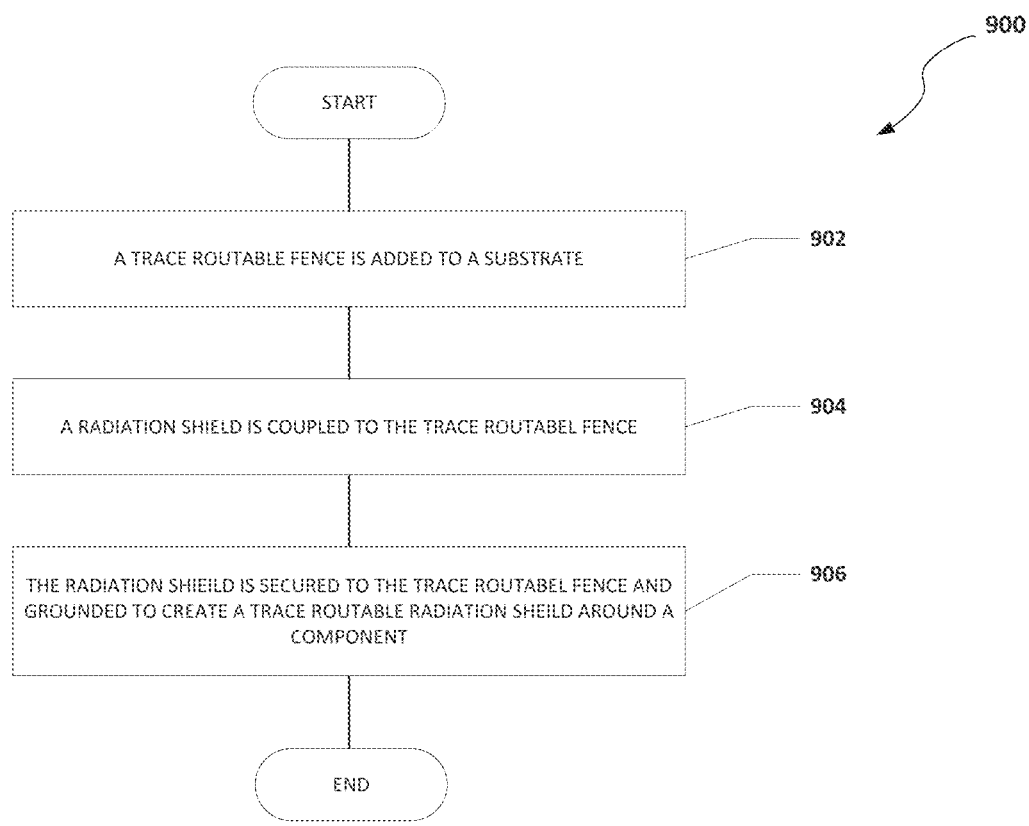
FIG. 9 is a simplified flowchart illustrating potential operations that may be associated with the system in accordance with an embodiment.

Turning to FIG. 9, FIG. 9 is an example flowchart illustrating possible operations of a flow 1600 that may be associated with enabling a trace routable radiation shield, in accordance with an embodiment. At 902, a trace routable fence is added to a substrate. At 904, a radiation shield is coupled to the trace routable fence. At 906, the radiation shield is secured to the trace routable fence and grounded to create a trace routable radiation shield around a component. The component can be a component that emits radiation and the trace routable radiation shield can be used to shield other components from the radiation or the component can be a component that needs shielding from radiation and the trace routable radiation shield can be used to shield the component from radiation.

Figure 10:
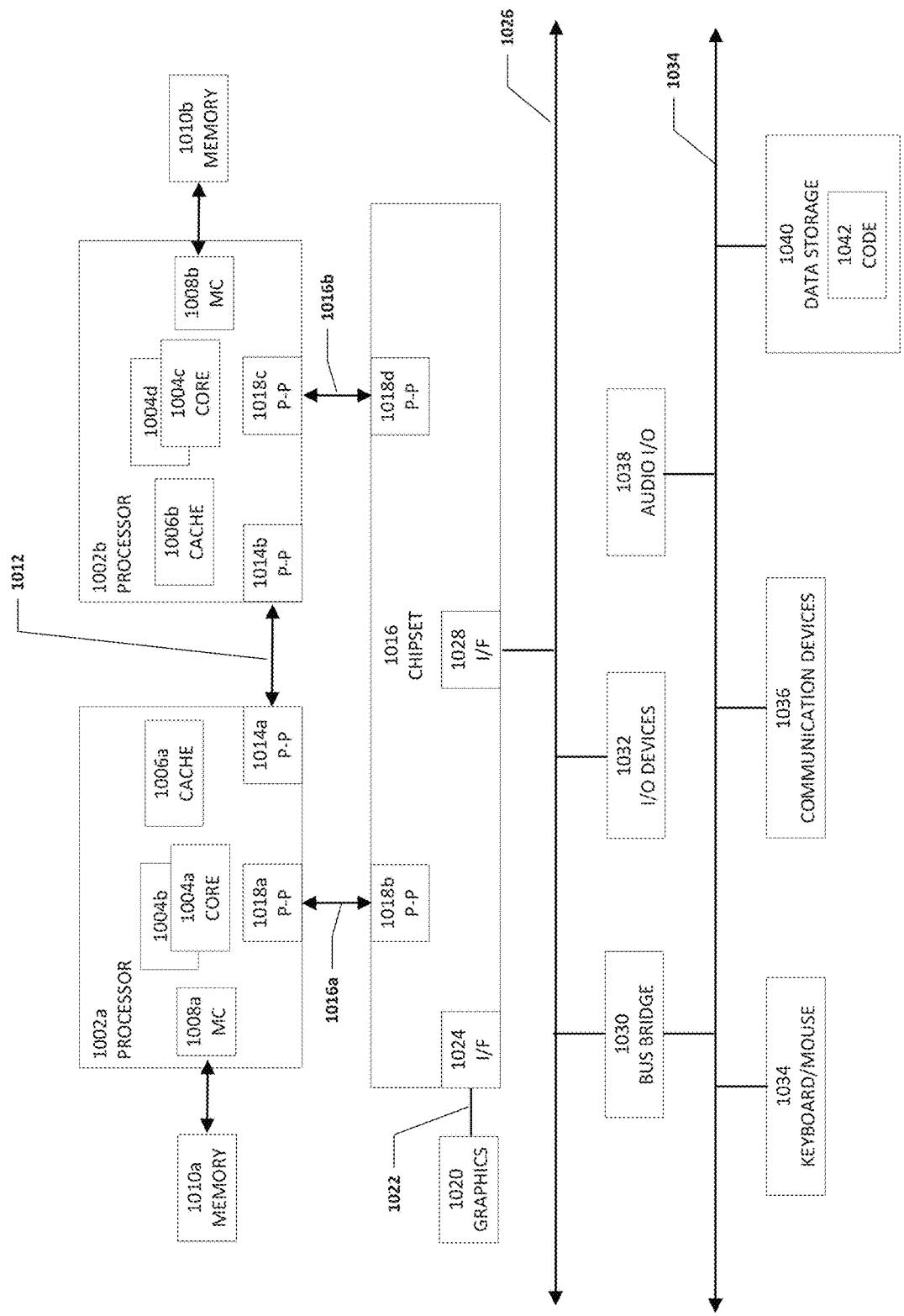
FIG. 10 is a block diagram illustrating an example computing system that is arranged in a point-to-point configuration in accordance with an embodiment.

Turning to FIG. 10, FIG. 10 illustrates a computing system 1000 that is arranged in a point-to-point (PtP) configuration according to an embodiment. In particular, FIG. 10 shows a system where processors, memory, and input/output devices are interconnected by a number of point-to-point interfaces. Generally, one or more of the network elements of electronic device 100a-100d (e.g., radiation sources 110 and/or radiation sensitive device 112) may be configured in the same or similar manner as computing system 1000.

As illustrated in FIG. 10, system 1000 may include several processors, of which only two, processors 1002a and 1002b, are shown for clarity. While two processors 1002a and 1002b are shown, it is to be understood that an embodiment of system 1000 may also include only one such processor. Processors 1002a and 1002b may each include a set of cores (i.e., processors cores 1004a and 1004b and processors cores 1004c and 1004d) to execute multiple threads of a program. The cores may be configured to execute instruction code. Each processor 1002a and 1002b may include at least one shared cache 1006a and 1006b respectively. Shared caches 1006a and 1006b may each store data (e.g., instructions) that are utilized by one or more components of processors 1002a and 1002b, such as processor cores 1004a and 1004b of processor 1002a and processor cores 1004c and 1004d of processor 1002b.

Processors 1002a and 1002b may also each include integrated memory controller logic (MC) 1008a and 1008b respectively to communicate with memory elements 1010a and 1010b. Memory elements 1010a and/or 1010b may store various data used by processors 1002a and 1002b. In alternative embodiments, memory controller logic 1008a and 1008b may be discrete logic separate from processors 1002a and 1002b.

Processors 1002a and 1002b may be any type of processor and may exchange data via a point-to-point (PtP) interface 1012 using point-to-point interface circuits 1014a and 1014b respectively. Processors 1002a and 1002b may each exchange data with a chipset 1016 via individual point-to-point interfaces 1018a and 1018b using point-to-point interface circuits 1020a-1020d. Chipset 1016 may also exchange data with a high-performance graphics circuit 1022 via a high-performance graphics interface 1024, using an interface circuit 1026, which could be a PtP interface circuit. In alternative embodiments, any or all of the PtP links illustrated in FIG. 10 could be implemented as a multi-drop bus rather than a PtP link.

Chipset 1016 may be in communication with a bus 1028 via an interface circuit 1030. Bus 1028 may have one or more devices that communicate over it, such as a bus bridge 1032 and I/O devices 1034. Via a bus 1036, bus bridge 1032 may be in communication with other devices such as a keyboard/mouse 1038 (or other input devices such as a touch screen, trackball, etc.), communication devices 1040 (such as modems, network interface devices, or other types of communication devices that may communicate through a network), audio I/O devices 1042, and/or a data storage device 1044. Data storage device 1044 may store code 1046, which may be executed by processors 1002a and/or 1002b. In alternative embodiments, any portions of the bus architectures could be implemented with one or more PtP links.

The computer system depicted in FIG. 10 is a schematic illustration of an embodiment of a computing system that may be utilized to implement various embodiments discussed herein. It will be appreciated that various components of the system depicted in FIG. 10 may be combined in a system-on-a-chip (SoC) architecture or in any other suitable configuration. For example, embodiments disclosed herein can be incorporated into systems including mobile devices such as smart cellular telephones, tablet computers, personal digital assistants, portable gaming devices, etc. It will be appreciated that these mobile devices may be provided with SoC architectures in at least some embodiments.

Figure 11:
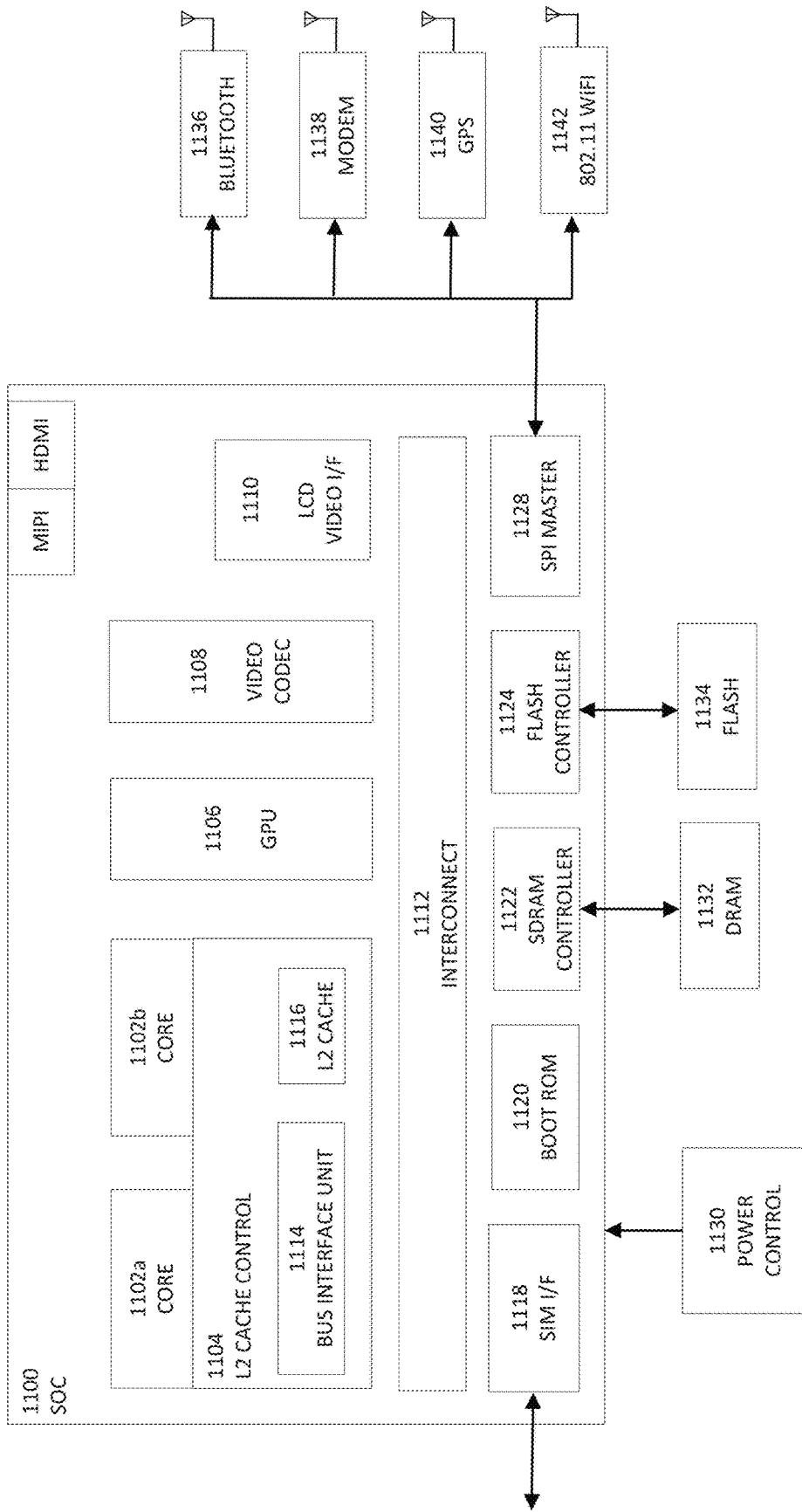
FIG. 11 is a simplified block diagram associated with an example ARM ecosystem system on chip (SOC) of the present disclosure.

Turning to FIG. 11, FIG. 11 is a simplified block diagram associated with an example ecosystem SOC 1100 of the present disclosure. At least one example implementation of the present disclosure can include the device pairing in a local network features discussed herein and an ARM component. For example, the example of FIG. 11 can be associated with any ARM core (e.g., A-9, A-15, etc.). Further, the architecture can be part of any type of tablet, smartphone (inclusive of Android™ phones, iPhones™), iPad™, Google Nexus™, Microsoft Surface™, personal computer, server, video processing components, laptop computer (inclusive of any type of notebook), Ultrabook™ system, any type of touch-enabled input device, etc.

In this example of FIG. 11, ecosystem SOC 1100 may include multiple cores 1102a and 1102b, an L2 cache control 1104, a graphics processing unit (GPU) 1106, a video codec 1108, a liquid crystal display (LCD) I/F 1110 and an interconnect 1112. L2 cache control 1104 can include a bus interface unit 1114, a L2 cache 1116. Liquid crystal display (LCD) I/F 1110 may be associated with mobile industry processor interface (MIPI)/high-definition multimedia interface (HDMI) links that couple to an LCD.

Ecosystem SOC 1100 may also include a subscriber identity module (SIM) I/F 1118, a boot read-only memory (ROM) 1120, a synchronous dynamic random-access memory (SDRAM) controller 1122, a flash controller 1124, a serial peripheral interface (SPI) master 1128, a suitable power control 1130, a dynamic RAM (DRAM) 1132, and flash 1134. In addition, one or more embodiments include one or more communication capabilities, interfaces, and features such as instances of Bluetooth™ 1136, a 3G modem 0138, a global positioning system (GPS) 1140, and an 802.11 Wi-Fi 1142.

In operation, the example of FIG. 11 can offer processing capabilities, along with relatively low power consumption to enable computing of various types (e.g., mobile computing, high-end digital home, servers, wireless infrastructure, etc.). In addition, such an architecture can enable any number of software applications (e.g., Android™, Adobe® Flash® Player, Java Platform Standard Edition (Java SE), JavaFX, Linux, Microsoft Windows Embedded, Symbian and Ubuntu, etc.). In at least one example embodiment, the core processor may implement an out-of-order superscalar pipeline with a coupled low-latency level-2 cache.

Figure 12:
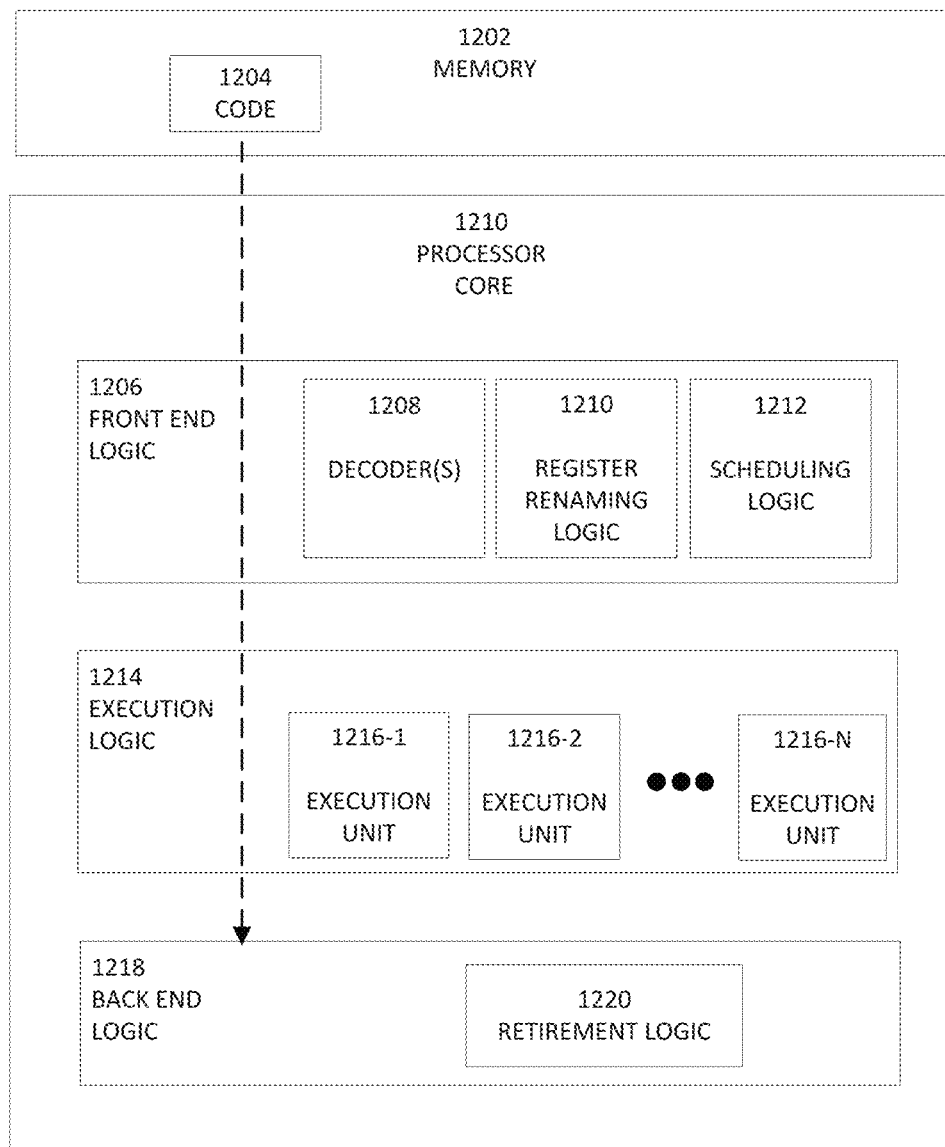
FIG. 12 is a block diagram illustrating an example processor core in accordance with an embodiment.

FIG. 12 illustrates a processor core 1200 according to an embodiment. Processor core 1200 may be the core for any type of processor, such as a micro-processor, an embedded processor, a digital signal processor (DSP), a network processor, or other device to execute code. Although only one processor core 1200 is illustrated in FIG. 12, a processor may alternatively include more than one of the processor core 1200 illustrated in FIG. 12. For example, processor core 1200 represents one example embodiment of processors cores 1074a, 1074b, 1084a, and 1084b shown and described with reference to processors 1002a and 1002b of FIG. 10. Processor core 1200 may be a single-threaded core or, for at least one embodiment, processor core 1200 may be multi-threaded in that it may include more than one hardware thread context (or "logical processor") per core.

FIG. 12 also illustrates a memory 1202 coupled to processor core 1200 in accordance with an embodiment. Memory 1202 may be any of a wide variety of memories (including various layers of memory hierarchy) as are known or otherwise available to those of skill in the art. Memory 1202 may include code 1204, which may be one or more instructions, to be executed by processor core 1200. Processor core 1200 can follow a program sequence of instructions indicated by code 1204. Each instruction enters a front-end logic 1206 and is processed by one or more decoders 1208. The decoder may generate, as its output, a micro-operation such as a fixed width micro-operation in a predefined format, or may generate other instructions, microinstructions, or control signals that reflect the original code instruction. Front-end logic 1206 also includes register renaming logic 1210 and scheduling logic 1212, which generally allocate resources and queue the operation corresponding to the instruction for execution.

Processor core 1200 can also include execution logic 1214 having a set of execution units 1216-1 through 1216-N. Some embodiments may include a number of execution units dedicated to specific functions or sets of functions. Other embodiments may include only one execution unit or one execution unit that can perform a particular function. Execution logic 1214 performs the operations specified by code instructions.

After completion of execution of the operations specified by the code instructions, back-end logic 1218 can retire the instructions of code 1204. In one embodiment, processor core 1200 allows out of order execution but requires in order retirement of instructions. Retirement logic 1220 may take a variety of known forms (e.g., re-order buffers or the like). In this manner, processor core 1200 is transformed during execution of code 1204, at least in terms of the output generated by the decoder, hardware registers and tables utilized by register renaming logic 1210, and any registers (not shown) modified by execution logic 1214.

Although not illustrated in FIG. 12, a processor may include other elements on a chip with processor core 1200, at least some of which were shown and described herein with reference to FIG. 10. For example, as shown in FIG. 10, a processor may include memory control logic along with processor core 1200. The processor may include I/O control logic and/or may include I/O control logic integrated with memory control logic.

Note that with the examples provided herein, interaction may be described in terms of two, three, or more elements. However, this has been done for purposes of clarity and example only. In certain cases, it may be easier to describe one or more of the functionalities of a given set of flows by only referencing a limited number of elements. It should be appreciated that electronic devices 102a-102d and their teachings are readily scalable and can accommodate a large number of components, as well as more complicated/sophisticated arrangements and configurations. Accordingly, the examples provided should not limit the scope or inhibit the broad teachings of electronic devices 102a-102d and as potentially applied to a myriad of other architectures.

Although the present disclosure has been described in detail with reference to particular arrangements and configurations, these example configurations and arrangements may be changed significantly without departing from the scope of the present disclosure. Moreover, certain components may be combined, separated, eliminated, or added based on particular needs and implementations. Additionally, although electronic devices 102a-102d have been illustrated with reference to particular elements and operations, these elements and operations may be replaced by any suitable architecture, protocols, and/or processes that achieve the intended functionality of electronic devices 102a-102d.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

Other Notes and Examples

In Example A1, trace routable radiation shield coupled to a substrate can include a trace routable fence coupled to the substrate, traces that extend from the substrate, into the trace routable fence, and back to the substrate, and a radiation shield.

In Example A2, the subject matter of Example A1 can optionally include where the trace routable fence includes a ground that is coupled to a ground on the substrate.

In Example A3, the subject matter of any one of Examples A1-A2 can optionally include where the radiation shield is coupled to the ground in the trace routable fence.

In Example A4, the subject matter of any one of Examples A1-A3 can optionally include where the trace routable fence includes a plurality of trace paths, a non-conductive body, a ground, and a radiation shield coupler housing.

In Example A5, the subject matter of any one of Examples A1-A4 can optionally include where the radiation shield includes a radiation shield lid, ground coupling, and a radiation shield coupler.

In Example A6, the subject matter of any one of Examples A1-A5 can optionally include where the ground coupling on the radiation shield couples with the ground on the trace routable fence.

In Example A7, the subject matter of any one of Examples A1-A6 can optionally include where the radiation shield coupler couples to the radiation shield coupler housing.

In Example A8, the subject matter of any one of Examples A1-A7 can optionally include where radiation shield coupler housing is grounded.

In Example A9, the subject matter of any one of Examples A1-A8 can optionally include where the radiation shield mitigates the effects at least a portion of electromagnetic interference and/or radio-frequency interference emitted from a radiation source.

Example AA1 is an electronic device including a substrate that includes traces, a radiation source on the substrate, and a trace routable radiation shield on the substrate. At least a portion of the traces from the substrate extend through the trace routable radiation shield and the trace routable radiation shield can help shield radiation sensitive components from at least a portion of the radiation from the radiation source.

In Example AA2, the subject matter of Example AA1 can optionally include where the trace routable radiation shield includes a trace routable fence coupled to the substrate and the portion of the traces from the substrate extend through the trace routable fence, where the trace routable fence is comprised of the same material as the substrate.

In Example AA3, the subject matter of any one of Examples AA1-AA2 can optionally include where the trace routable radiation shield includes a radiation shield coupled to a ground in the trace routable fence.

In Example AA4, the subject matter of any one of Examples AA1-AA3 can optionally include where the trace routable fence includes a plurality of trace paths, a non-conductive body, a ground, and a radiation shield coupler housing.

In Example AA5, the subject matter of any one of Examples AA1-AA4 can optionally include where the trace routable radiation shield includes a radiation shield, and the radiation shield includes a radiation shield lid, ground coupling, and a radiation shield coupler.

In Example AA6, the subject matter of any one of Examples AA1-AA5 can optionally include where the radiation source emits electromagnetic interference and/or radio-frequency interference.

Example M1 is a method including identifying a substrate that includes traces, identifying a radiation source on the substrate, and creating a trace routable radiation shield on the substrate, where at least a portion of the traces extend through the trace routable radiation shield and the trace routable radiation shield can help shield radiation sensitive components from at least a portion of the radiation from the radiation source.

In Example M2, the subject matter of Example M1 can optionally include where the trace routable radiation shield includes a trace routable fence coupled to the substrate and the trace routable fence includes a plurality of trace paths, a non-conductive body, a ground, and a radiation shield coupler housing.

In Example M3, the subject matter of any one of the Examples M1-M2 can optionally include where the trace routable radiation shield includes a radiation shield coupled to a ground in the trace routable radiation shield.

In Example M4, the subject matter of any one of the Examples M1-M3 can optionally include where the radiation shield includes a radiation shield lid, ground coupling, and a radiation shield coupler.

In Example M5, the subject matter of any one of the Examples M1-M4 can optionally include where the ground coupling on the radiation shield couples with a ground on a trace routable fence and the radiation shield coupler couples to a radiation shield coupler housing on the trace routable fence.

What is claimed is:

1. A trace routable radiation shield coupled to a substrate, the trace routable radiation shield comprising:
   a trace routable fence coupled to the substrate, wherein the trace routable fence includes a non-conductive body with radiation shield traces within the non-conductive body, and includes a radiation shield coupler housing recessed in the non-conductive body of the trace routable fence;
   a plurality of ground connections located on a side of the non-conductive body that faces the substrate;
   a plurality of trace paths designed to provide paths for the radiation shield traces, wherein the non-conductive body surrounds each trace path and the non-conductive body is between each trace path and a ground connection from the plurality of ground connections;
   substrate traces in the substrate, wherein at least a portion of the substrate traces electrically couple with the trace paths to electrically couple with the radiation shield traces in the trace routable fence to allow traces to be routed from the substrate to the trace routable fence and from the trace routable fence back to the substrate; and
   a radiation shield coupled to the trace routable fence.

2. The trace routable radiation shield of claim 1, wherein the trace routable fence includes a ground that is coupled to a ground on the substrate.

3. The trace routable radiation shield of claim 2, wherein the radiation shield is coupled to the ground in the trace routable fence.

4. The trace routable radiation shield of claim 1, wherein the radiation shield includes a radiation shield lid, ground coupling, and a radiation shield coupler.

5. The trace routable radiation shield of claim 4, wherein the ground coupling on the radiation shield couples with the ground on the trace routable fence.

6. The trace routable radiation shield of claim 4, wherein the radiation shield coupler couples to the radiation shield coupler housing recessed in the non-conductive body of the trace routable fence.

7. The trace routable radiation shield of claim 6, wherein the radiation shield coupler housing is grounded.

8. The trace routable radiation shield of claim 1, wherein the radiation shield mitigates effects at least a portion of electromagnetic interference and/or radio-frequency interference emitted from a radiation source.

9. An electronic device comprising:
a substrate that includes traces;
a radiation source on the substrate; and
a trace routable radiation shield on the substrate, wherein the trace routable radiation shield includes:
a trace routable fence coupled to the substrate, wherein the trace routable fence includes a non-conductive body with radiation shield traces within the non-conductive body, and includes a radiation shield coupler housing recessed in the non-conductive body of the trace routable fence;
a plurality of ground connections located on a side of the non-conductive body that faces the substrate; and
a plurality of trace paths designed to provide paths for the radiation shield traces, wherein at least one ground connection surrounds at least a portion of the plurality of trace paths, wherein the non-conductive body surrounds each trace path and is between each trace path and the at least one ground connection that surrounds at least a portion of the plurality of trace paths, wherein at least a portion of the traces from the substrate electrically couple with at least a portion of the trace paths to electrically couple with the radiation shield traces and allow traces to be routed from the substrate to the trace routable fence and from the trace routable fence to the substrate, wherein the trace routable radiation shield can help shield radiation sensitive components from at least a portion of the radiation from the radiation source.

10. The electronic device of claim 9, wherein the trace routable fence is comprised of a same material as the substrate.

11. The electronic device of claim 9, wherein the trace routable radiation shield includes a radiation shield coupled to at least a portion of the ground connections in the trace routable fence.

12. The electronic device of claim 9, wherein the trace routable radiation shield includes a radiation shield, and the radiation shield includes a radiation shield lid, ground coupling, and a radiation shield coupler that couples with the radiation shield coupler housing.

13. The electronic device of claim 9, wherein the radiation source emits electromagnetic interference and/or radio-frequency interference.

14. A method comprising:
identifying a substrate that includes traces;
identifying a radiation source on the substrate; and
creating a trace routable radiation shield on the substrate, wherein the trace routable radiation shield includes:
a trace routable fence coupled to the substrate, wherein the trace routable fence includes a non-conductive body with radiation shield traces within the non-conductive body;
a plurality of ground connections located on a side of the non-conductive body that faces the substrate;
a plurality of trace paths designed to provide paths for the radiation shield traces, wherein the non-conductive body surrounds each trace path and is between each trace path and a ground connection from the plurality of ground connections, wherein at least a portion of the traces electrically couple with the trace paths to electrically couple with the radiation shield traces and allow traces to be routed from the substrate to the trace routable fence and from the trace routable fence to the substrate, wherein the trace routable radiation shield can help shield radiation sensitive components from at least a portion of the radiation from the radiation source; and
a radiation shield coupler housing recessed in the non-conductive body of the trace routable fence.

15. The method of claim 14, wherein the trace routable radiation shield includes a radiation shield coupled to a ground in the trace routable radiation shield.

16. The method of claim 15, wherein the radiation shield includes a radiation shield lid, ground coupling, and a radiation shield coupler that couples with the radiation shield coupler housing.

17. The method of claim 16, wherein the ground coupling on the radiation shield couples with a ground on the trace routable fence.

* * * * *